United States Patent [19]

Melton et al.

[11] Patent Number: 5,844,315
[45] Date of Patent: Dec. 1, 1998

[54] LOW-PROFILE MICROELECTRONIC PACKAGE

[75] Inventors: Cynthia M. Melton, Bolingbrook; George N. Demet, Lake Forest; Iwona Turlik, Barrington, all of Ill.

[73] Assignee: Motorola Corporation, Schaumburg, Ill.

[21] Appl. No.: 621,912

[22] Filed: Mar. 26, 1996

[51] Int. Cl.$^6$ .......................... H01L 23/48; H01L 29/40; H01L 23/495

[52] U.S. Cl. ........................ 257/738; 257/737; 257/686; 257/666; 257/778; 257/692; 257/685; 257/774

[58] Field of Search ..................... 257/690, 734, 257/737, 738, 777–782, 772, 666, 686, 685, 692, 786, 787; 361/783, 761; 29/827, 846, 832; 174/52.4

[56] References Cited

U.S. PATENT DOCUMENTS

| | | | |
|---|---|---|---|
| 5,019,673 | 5/1991 | Juskey et al. | 174/522 |
| 5,218,759 | 6/1993 | Juskey et al. | 29/840 |
| 5,220,489 | 6/1993 | Barreto et al. | 361/400 |
| 5,241,133 | 8/1993 | Mullen, III et al. | 257/787 |
| 5,278,726 | 1/1994 | Bernardoni et al. | 257/787 |
| 5,285,352 | 2/1994 | Pastore et al. | 257/712 |
| 5,334,857 | 8/1994 | Mennitt et al. | 257/737 |
| 5,608,265 | 3/1997 | Kitano et al. | 257/738 |
| 5,616,958 | 4/1997 | Laine et al. | 257/778 |
| 5,677,566 | 10/1997 | King et al. | 257/738 |

*Primary Examiner*—Tom Thomas
*Assistant Examiner*—Alexander Oscar Williams
*Attorney, Agent, or Firm*—Douglas D. Fekete; John B. MacIntyre

[57] ABSTRACT

A microelectronic package (10) is formed by placing a lead frame (22) onto an adhesive polyimide tape (38). The lead frame (22) includes a plurality of metallic leads (16) and an opening. An integrated circuit die (12) is positioned onto the molding support (38) within the opening such that a non-active face (32) of the integrated circuit die (12) rests against the molding support (38). Wire leads (18) connect an active face (28) of the integrated circuit die (12) to the metallic leads (16). A plurality of metallic bumps (20) are attached to the metallic leads (16), and a polymeric precursor is dispensed. The precursor embeds the active face (28) of the integrated circuit die (12), the inner surface (19) of the metallic leads (16), the wire leads (18), and the metallic bumps (20). The microelectronic package (10) is then heated to cure the polymeric precursor to form a polymeric body (14). The microelectronic package (10) is then capable of being tested and subsequently attached to a printed circuit board (40) to form a low-profile microelectronic assembly (11).

25 Claims, 2 Drawing Sheets

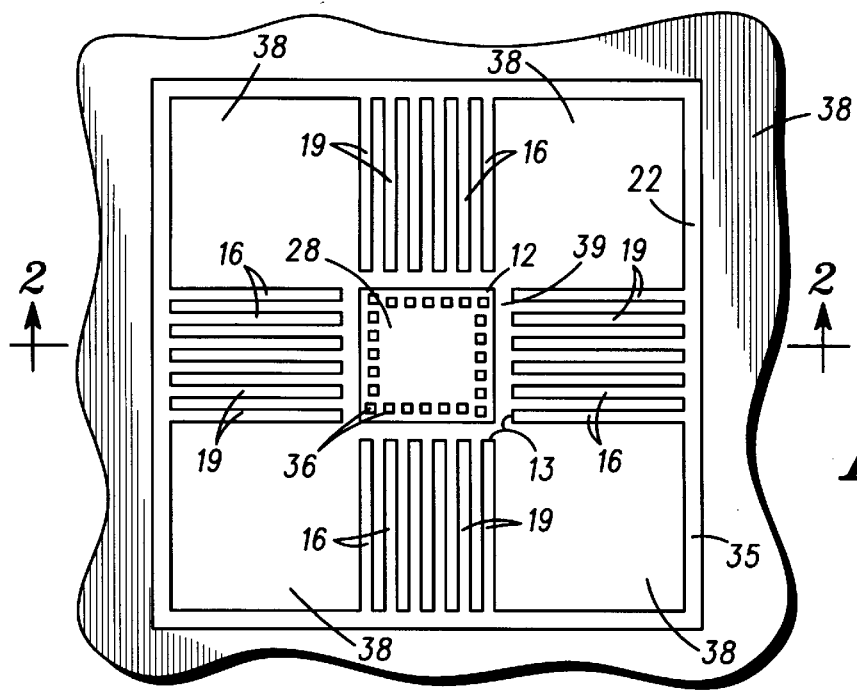
FIG. 1
FIG. 2
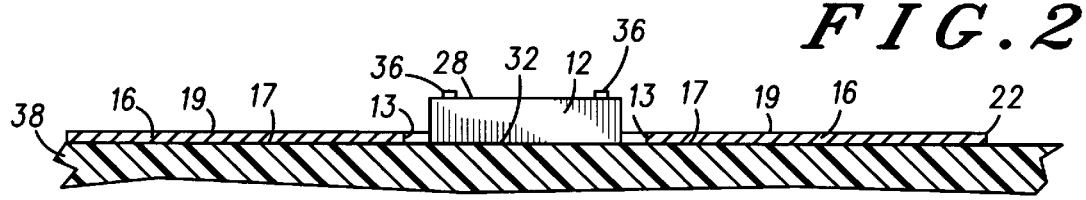
FIG. 3
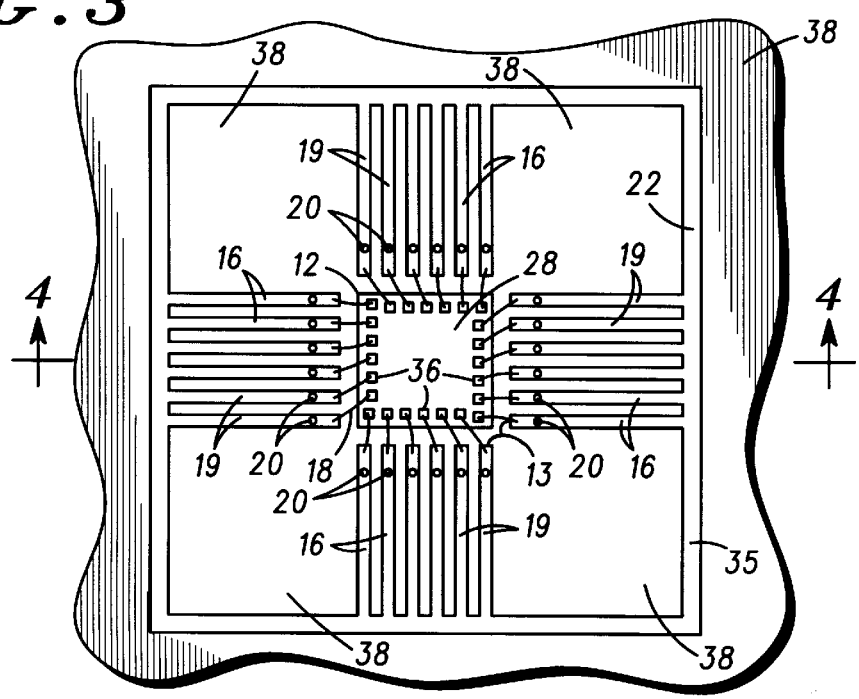

LOW-PROFILE MICROELECTRONIC PACKAGE

FIELD OF THE INVENTION

This invention relates generally to a microelectronic package for mounting an integrated circuit die onto a printed circuit board by solder interconnections. More particularly, this invention relates to a microelectronic package wherein metallic bumps are embedded into a polymeric body prior to attaching the microelectronic package to a printed circuit board.

BACKGROUND OF THE INVENTION

It is known to form microelectronic packages that include an integrated circuit die and are attached to printed circuit boards by solder interconnections to form microelectronic assemblies. The solder interconnections physically attach and electrically connect the integrated circuit die to the printed circuit board to facilitate transmission of electrical signals to and from the integrated circuit die for processing. One type of microelectronic package, referred to as a ball grid array (BGA) package, comprises an integrated circuit die mounted on a carrier that is in turn attached to a printed circuit board by solder interconnections. The carrier is expensive and increases the footprint and profile of the microelectronic package and the printed circuit board and, consequently, the size of the microelectronic assembly.

Another technique for attaching an integrated circuit die to a printed circuit board is referred to as direct chip attach, known as DCA. In DCA, an integrated circuit die is directly attached to a printed circuit board. This technique reduces the area needed on the printed circuit board by eliminating the carrier used in BGA packages. However, because of the small size of the solder bumps on the integrated circuit die, typically having a diameter less than 125 microns, an underfilling encapsulant is needed to support and protect the solder interconnections. The process of underfilling the integrated circuit die is time-consuming, and there are difficulties associated with ensuring that the entire integrated circuit die is underfilled. Further, due to the small size of the solder interconnections, it is difficult to test the integrated circuit die prior to attachment to the printed circuit board. If the integrated circuit die is found to be defective after attachment to the printed circuit board, the integrated circuit die and the encapsulant have to be removed from the printed circuit board and replaced. This rework is time-consuming and expensive.

Therefore, a need exists for a low-cost microelectronic assembly wherein an integrated circuit die is connected to a printed circuit board by solder interconnections to form a low-profile microelectronic assembly and wherein the area of the printed circuit board required to attach the integrated circuit die is reduced. Further, a need exists for a microelectronic package that facilitates testing of the integrated circuit die before the integrated circuit die is attached to a printed circuit board.

BRIEF DESCRIPTION OF THE DRAWINGS

FIG. 1 is a top plan view showing elements in preparation for making a microelectronic package in accordance with the present invention;

FIG. 2 is a cross-sectional view of FIG. 1 taken along line 2—2;

FIG. 3 is a top plan view of an arrangement of components similar to FIG. 1 during a subsequent step in the manufacture of the microelectronic package of the present invention;

DETAILED DESCRIPTION OF A PREFERRED EMBODIMENT

The present invention provides a smaller, less expensive microelectronic package and assembly. In a preferred embodiment of the present invention, a lead frame is placed onto a molding support, such as a flexible polyimide tape having an adhesive coating. The lead frame comprises a plurality of metallic leads that define an opening. An integrated circuit die is positioned onto the molding support within the opening of the lead frame such that a non-active face of the integrated circuit die rests against the molding support. Wire leads connect the active face of the integrated circuit die to the metallic leads. Metallic bumps are attached to the metallic leads, and a polymeric precursor is dispensed. The precursor covers the active face of the integrated circuit die, one face of the metallic leads, the wire leads, and the metallic bumps. The resulting package is then heated to cure the polymeric precursor to form a polymeric body. The microelectronic package is then capable of being tested and subsequently attached to a printed circuit board. In this manner, a microelectronic package is formed that has a small footprint, a low profile, is inexpensive, and is able to be tested prior to attachment to a printed circuit board to form a microelectronic assembly.

Figure 4:
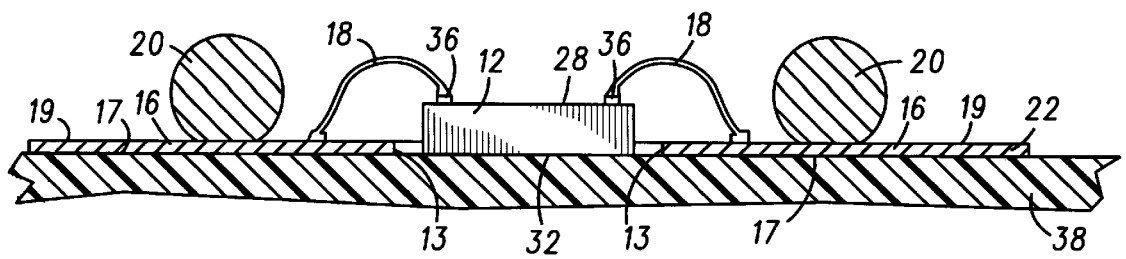
FIG. 4 is a cross-sectional view of FIG. 3 taken along line 4—4.
Figure 5:
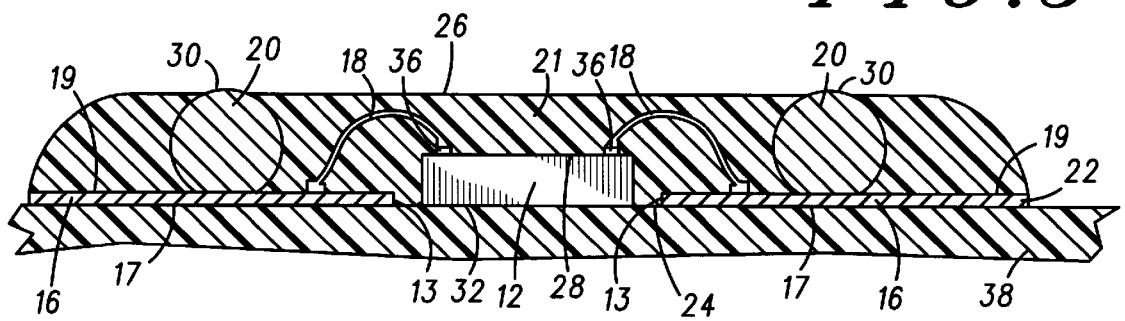
FIG. 5 is a cross-sectional view similar to FIG. 4 showing the components following further steps in the manufacture of a microelectronic package in accordance with the present invention.
Figure 6:
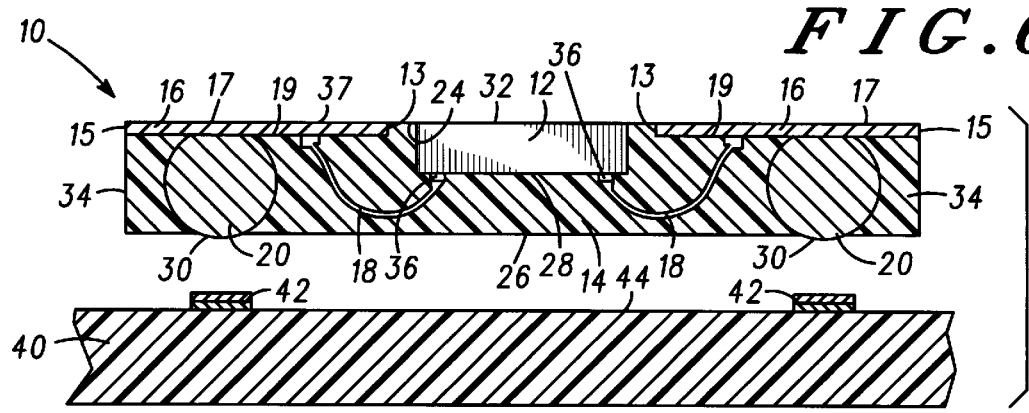
FIG. 6 is a cross-sectional view of the microelectronic package arranged with a printed circuit board in preparation for forming a microelectronic assembly in accordance with the present invention.

In a preferred embodiment of the present invention, a microelectronic package 10 in FIG. 6 is manufactured by a method depicted in FIGS. 1–5. With reference to FIGS. 1 and 2, a lead frame 22 is placed onto a molding support 38. Lead frame 22 is preferably composed of copper or a copper-base alloy and is formed from a metal sheet by stamping, chemical etching, or other suitable processes. Lead frame 22 has a preferable thickness between about 50 and 400 microns. Lead frame 22 comprises an outer ring element 35 and a plurality of metallic leads 16 that extend inwardly from outer ring element 35, each metallic lead 16 having a die proximate end 13. Die proximate ends 13 define an opening that is sized and shaped to receive integrated circuit die 12. Each metallic lead 16 comprises an inner surface 19 and an outer surface 17, outer surface 17 resting against molding support 38 during processing. In a preferred embodiment, molding support 38 is formed of a flexible polyimide tape having an adhesive coating for temporarily securing integrated circuit die 12 and lead frame 22 during processing, and permits the molding support 38 to be easily removed from the product microelectronic package.

In a preferred embodiment, integrated circuit die 12 is positioned onto molding support 38 within the opening such that the distance between die proximate ends 13 and integrated circuit die 12 is between about 50 and 500 microns. This spacing is large enough to ensure accurate connections between integrated circuit die 12 and metallic leads 16, while keeping the package small enough to be useful in reducing the size of the overall assembly. Integrated circuit die 12 comprises an active face 28 and a non-active face 32, which rests against molding support 38 to position and secure integrated circuit die 12 during processing. Non-active face 32 is generally planar and is secured by molding support 38 during processing. Integrated circuit die 12 further comprises a plurality of die bond pads 36 located on active face 32 that are adapted to bond to a plurality of wire leads.

Now referring to FIGS. 3 and 4, a plurality of wire leads 18 are connected to die bond pads 36 and inner surface 19 such that each die bond pad 36 is connected to a corresponding metallic lead 16 at inner surface 19 proximal to die proximate end 13. By way of an example of a suitable wire bonding operation, integrated circuit die 12 and lead frame 22 are heated to between about 150° C. and 180° C. and wire leads 18 are thermo-compression bonded to die bond pads 36 and wedge bonded to inner surface 19. Alternately, wire leads 18 can be bonded to die bond pads 36 or metallic leads 16 by an ultrasonic scrub bonding process. Wire leads 18 are formed of any conductive material capable of electrically connecting die bond pads 36 to metallic leads 16, with a preferred wire lead 18 being composed of gold thread.

A plurality of metallic bumps 20 are attached to metallic leads 16. In a preferred embodiment, a metallic bump 20 is attached to inner surface 19 of each metallic lead 16 by an ultrasonic scrub bonding process and is disposed between wire lead 18 and outer ring element 35. Metallic bumps 20 can be formed of any composition that allows for later attachment and reflow to bond pads or the like located on a printed circuit board. A preferred composition of metallic bumps 20 is a tin-lead solder being formed of 10 weight percent tin and the balance substantially lead and having a melting temperature of about 280° C. Alternately, metallic bumps 20 can be formed of copper or other solder-wettable bond pads that can be connected to a printed circuit board by solder interconnections. In a preferred embodiment, metallic bumps 20 have a melting temperature higher than the curing temperature of the polymeric precursor, to avoid melting of metallic bumps 20 during the curing of the precursor. Metallic bumps 20 have a diameter of between about 250 and 500 microns, which is large enough to form mechanically reliable solder connections that facilitate the testing of the microelectronic package prior to attachment to a printed circuit board, thereby assuring operability of the product microelectronic assembly.

Now referring to FIG. 5, subsequent to the connection of wire leads 18 and the attachment of metallic bumps 20, a polymeric precursor is dispensed onto microelectronic package 10 and cured to form preform 21. In a preferred embodiment, the polymeric precursor is dispensed by a syringe or the like. Alternately, the precursor can be stenciled onto molding support 38. The polymeric precursor is applied to active face 28 of integrated circuit die 12, inner face 24 of metallic leads 16, wire leads 18, and a portion of metallic bumps 20, as well as exposed regions of molding support 38. In a preferred embodiment, the polymeric precursor is an epoxy resin. A suitable polymeric precursor is Dexter Hysol FP4450 made by The Dexter Corporation. The precursor is applied to a thickness less than the height of metallic bumps 20 to permit bonding surface 30 to protrude from the polymeric encapsulant to allow each metallic bump 20 to be later attached to a bond pad or solder bump located on a printed circuit board or the like.

After dispensing, the polymeric precursor is cured at a temperature lower than the melting temperature of metallic bumps 20, preferably about 150° C. for about one hour, to form preform 21. In order to further reduce the size and weight of microelectronic package 10, preform 21 and metallic leads 16 are trimmed to form microelectronic package 10, as shown in FIG. 6. In a preferred embodiment, polymeric body 14 and metallic leads 16 are trimmed such that perimeter ends 15 of metallic leads 16 are coextensive with polymeric body perimeter 34. During trimming, the outer ring element is severed from metallic leads 16 to ensure that metallic leads 16 are electrically discrete. A preferred method of trimming package 10 is by use of a router, although laser trimming and punch presses can be also used to trim package 10. Microelectronic package 10 is trimmed to decrease the size and weight of package 10, thereby reducing the size and weight of the microelectronic assembly to which it will be attached.

The resulting polymeric body 14 encapsulates active face 28 of integrated circuit die 12, the plurality of wire leads 18, inner surface 19, and metallic bumps 20, thereby protecting them from environmental exposure and damage experienced during normal use of microelectronic package 10. Second surface 26 is formed opposite first surface 24 by the surface tension of the polymeric precursor. In a preferred embodiment, first surface 24, non-active face 32, and outer surface 17 cooperate to form planar surface 37. Planar surface 37 facilitates the manipulation of microelectronic assembly 10 by conventional robotic end effectors having vacuum pickup ends or the like. Bonding surface 30 of each metallic bump 20 is exposed at second surface 26 of polymeric body 14 and protrudes from second surface 26 to provide a surface capable of forming reliable solder interconnections. The exposure of bonding surface 30 provides a bonding surface that is able to be attached to solder bumps or bond pads on a printed circuit board or the like.

Figure 7:
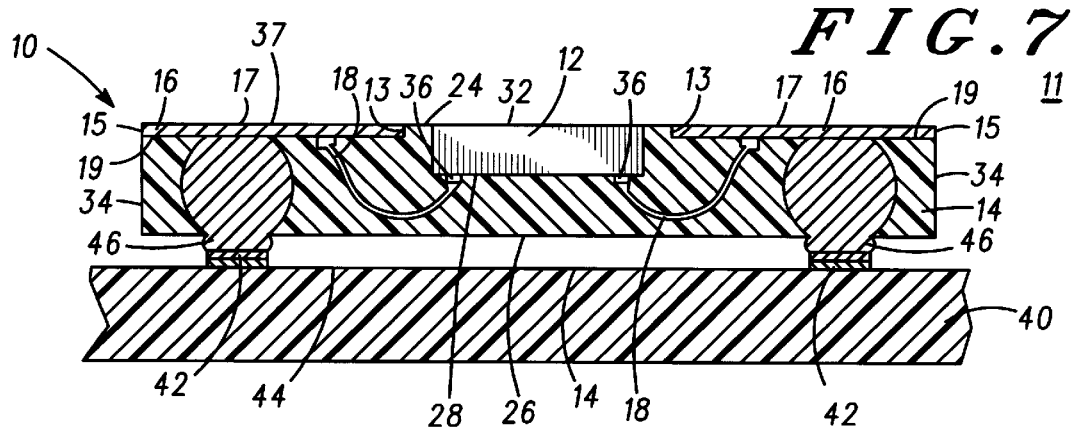
FIG. 7 is a cross-sectional view of the microelectronic assembly formed from the arrangement of FIG. 6.

As shown in FIG. 6, microelectronic package 10 is inverted for placement onto printed circuit board 40, which comprises a plurality of board bond pads 42 located on substrate 44. Board bond pads 42 are connected to metallic traces (not shown). In a preferred embodiment, microelectronic package 10 is positioned over printed circuit board 40 such that metallic bumps 20 are aligned with board bond pads 42. Board bond pads 42 comprise a solder-wettable surface, and are preferably composed of copper or a copper-base alloy coated with a protective layer of nickel plated with a thin layer of gold. Alternately, board bond pads 42 can be covered with solder, such as eutectic tin-lead solder, that is effective in forming solder interconnections between metallic bumps 20 and board bond pads 42. In a preferred embodiment, nickel and gold are electroplated onto the copper bond pads to reduce the oxidation of the copper surface in order to ensure a reliable connection between board bond pads 42 and metallic bumps 20. The nickel layer has a thickness of about 150 microns and the gold layer has a thickness of about 8 microns. Microelectronic package 10 is placed onto printed circuit board 40, and microelectronic package 10 and printed circuit board 40 are reflowed at a temperature sufficient to bond metallic bumps 20 to board bond pads 42 by a plurality of solder interconnections 46, as shown in FIG. 7. The bonding of metallic bumps 20 to board bond pads 42 can be carried out at a temperature effective to further cure polymeric body 14. In this manner, microelectronic assembly 11 is formed of microelectronic package 10 attached to printed circuit board 40 through solder interconnections 46. Both microelectronic package 10 and microelectronic assembly 11 have low profiles due to the absence of a carrier from microelectronic package 10, thereby reducing the size and weight of microelectronic package 10 and microelectronic assembly 11. Preferably, molding support 38 is removed from microelectronic package 10 to further reduce the profile and weight of microelectronic package 10 and microelectronic assembly 11.

In this manner, a low-profile microelectronic package is formed that is smaller, lighter, and has a lower-profile than previous microelectronic packages that contain carriers. Further, since the metallic bumps are larger than the solder balls attached directly to integrated circuit dies in direct chip attach packages, the package of the present invention can be tested prior to attachment to a printed circuit board. The problems associated with underfilling direct chip attach packages have been eliminating by forming a package having larger solder bumps that form a larger gap and consequently do not require the enhanced mechanical support that an underfilling encapsulant provides. The wire leads that connect the integrated circuit die to the metallic leads are embedded within the polymeric body to enhance their mechanical stability and protect them from corrosion and other environmental damage. The metallic leads are also embedded within the polymeric body, which protects the leads from oxidation and corrosion caused by exposure to environmental factors.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A microelectronic package comprising:
    a polymeric body having a first polymeric body surface and a second polymeric body surface opposite the first polymeric body surface;
    an integrated circuit die having an active face embedded into the first polymeric body surface;
    a plurality of metallic leads embedded into the polymeric body adjacent to the integrated circuit die, the metallic leads having outer surfaces exposed adjacent the first polymeric body surface and inner surfaces opposite the outer surfaces;
    a plurality of wire leads embedded into the polymeric body and connecting the active face to the metallic leads; and
    a plurality of metallic bumps bonded to the metallic leads and extending through the polymeric body from the inner surfaces to protrude from the second polymeric body surface, each said metallic bump comprising a bonding surface opposite each said metallic lead.

2. A microelectronic package in accordance with claim 1, wherein the microelectronic package further comprises a planar surface formed of the integrated circuit die, the polymeric body, and the plurality of metallic leads.

3. A microelectronic package in accordance with claim 1, wherein the polymeric body is formed of an epoxy resin having a curing temperature, and wherein the metallic bumps have a melting temperature higher than the curing temperature of the polymeric body.

4. A microelectronic package in accordance with claim 1, wherein the polymeric body has a perimeter, and wherein each said metallic lead has a perimeter end coextensive with the perimeter of the polymeric body.

5. A microelectronic package in accordance with claim 1, wherein the metallic leads are formed of copper or copper-base alloys.

6. A microelectronic package comprising:
    a polymeric body comprising a perimeter, a first surface, and a second surface opposite the first surface;
    an integrated circuit die having an active face, a generally planar non-active face, and a plurality of die bond pads located on the active face, said integrated circuit die being embedded into the first surface of the polymeric body such that the active face is covered by the polymeric body;
    a plurality of metallic leads embedded into the first surface of the polymeric body, each said metallic lead having an inner surface, a die proximate end adjacent to the integrated circuit die, and a perimeter end opposite the die proximate end;
    a plurality of wire leads embedded into the polymeric body and connecting the die bond pads to the die proximate ends; and
    a plurality of solder bumps bonded to the inner surface of the metallic leads intermediate each said wire lead and each said perimeter end, each said solder bump extending through the polymeric body and having a bonding surface exposed at the second surface to provide access for forming solder interconnections.

7. A microelectronic package in accordance with claim 6, wherein the microelectronic package comprises a planar surface formed by the polymeric body, the non-active face, and the metallic leads.

8. A microelectronic package in accordance with claim 6, wherein each said metallic lead has a perimeter end coextensive with the perimeter of the polymeric body.

9. A microelectronic package in accordance with claim 6, wherein the plurality of metallic leads are formed of copper or a copper-base alloy.

10. A microelectronic assembly comprising:
    a printed circuit board comprising a substrate and a plurality of board bond pads located on the substrate; and
    a microelectronic package comprising a polymeric body having a first polymeric body surface and a second polymeric body surface opposite the first polymeric body surface, an integrated circuit die having an active face embedded into the first polymeric body surface, a plurality of metallic leads embedded into the polymeric body adjacent to the integrated circuit die, the metallic leads having outer surfaces exposed adjacent to the first polymeric body surface and inner surfaces opposite the outer surfaces, a plurality of wire leads embedded into the polymeric body and connecting the active face of the integrated circuit die to the metallic leads, and a plurality of metallic bumps bonded to the metallic leads and extending through the polymeric body from the inner surfaces to protrude from the second polymeric body surface, each said metallic bump being bonded to a board bond pad.

11. A microelectronic assembly in accordance with claim 10, wherein the integrated circuit die further comprises a non-active face opposite the active face, and wherein the polymeric body, the non-active face, and the metallic leads cooperate to form a planar surface facing away from the printed circuit board.

12. A microelectronic assembly in accordance with claim 10, wherein the polymeric body has a perimeter, and wherein each said metallic lead has a perimeter end coextensive with the perimeter of the polymeric body.

13. A microelectronic assembly in accordance with claim 10, wherein the first polymeric body surface is remote from the printed circuit board.

14. A microelectronic assembly in accordance with claim 10, wherein the second polymeric body surface faces the printed circuit board.

15. A microelectronic assembly in accordance with claim 10, wherein each said metallic bump is solder bonded to a board bond pad.

16. A microelectronic assembly in accordance with claim 10, wherein the microelectronic assembly further comprises solder interconnections bonding the metallic bumps to the board bond pads.

17. A microelectronic assembly in accordance with claim 10, wherein the metallic bumps are composed of solder.

18. A microelectronic assembly comprising:

a printed circuit board comprising a substrate and a plurality of board bond pads located on the substrate;

a microelectronic package comprising a polymeric body having a first polymeric body surface and a second polymeric body surface opposite the first surface, an integrated circuit die having an active face embedded into the polymeric body, a plurality of metallic leads embedded into the polymeric body adjacent to the integrated circuit die, the metallic leads having outer surfaces exposed adjacent to the first polymeric body surface and inner surfaces opposite the outer surfaces, a plurality of wire leads embedded into the polymeric body and connecting the active face of the integrated circuit die to the metallic leads, and a plurality of metallic bumps bonded to the metallic leads and extending through the polymeric body from the inner surfaces to protrude from the second polymeric body surface, each said metallic bump comprising a bonding surface opposite each said metallic lead; and a plurality of solder interconnections connecting the board bond pads to the metallic bumps.

19. A microelectronic assembly in accordance with claim 18, wherein the integrated circuit die further comprises a non-active face opposite the active face, and wherein the polymeric body, the non-active face, and the metallic leads cooperate to form a planar surface facing away from the printed circuit board.

20. A microelectronic assembly in accordance with claim 18, wherein the polymeric body has a perimeter, and wherein each said metallic lead has a perimeter end coextensive with the perimeter of the polymeric body.

21. A microelectronic assembly in accordance with claim 18, wherein the first polymeric body surface is remote from the printed circuit board.

22. A microelectronic assembly in accordance with claim 18, wherein the second polymeric body surface is adjacent to the printed circuit board.

23. A microelectronic assembly in accordance with claim 18, wherein each said metallic bump is solder bonded to a board bond pad.

24. A microelectronic assembly in accordance with claim 18, wherein the microelectronic assembly further comprises solder interconnections bonding the metallic bumps to the board bond pads.

25. A microelectronic assembly in accordance with claim 18, wherein the metallic bumps are formed of solder.

* * * * *